(12) United States Patent
Maruko et al.

(10) Patent No.: US 12,340,995 B2
(45) Date of Patent: Jun. 24, 2025

(54) RUTHENIUM-BASED SPUTTERING TARGET AND METHOD FOR MANUFACTURING SAME

(71) Applicant: FURUYA METAL CO., LTD., Tokyo (JP)

(72) Inventors: Tomohiro Maruko, Tokyo (JP); Hitoshi Arakawa, Tokyo (JP); Shohei Otomo, Tokyo (JP); Yu Suzuki, Tokyo (JP)

(73) Assignee: FURUYA METAL CO., LTD., Tokyo (JP)

( * ) Notice: Subject to any disclaimer, the term of this patent is extended or adjusted under 35 U.S.C. 154(b) by 500 days.

(21) Appl. No.: 17/609,356

(22) PCT Filed: Jun. 10, 2020

(86) PCT No.: PCT/JP2020/022829
§ 371 (c)(1),
(2) Date: Nov. 5, 2021

(87) PCT Pub. No.: WO2021/002167
PCT Pub. Date: Jan. 7, 2021

(65) Prior Publication Data
US 2022/0319824 A1   Oct. 6, 2022

(30) Foreign Application Priority Data

Jul. 1, 2019   (JP) ................. 2019-122996

(51) Int. Cl.
*H01J 37/34*   (2006.01)
*C23C 14/14*   (2006.01)
*C23C 14/34*   (2006.01)

(52) U.S. Cl.
CPC .......... *H01J 37/3426* (2013.01); *C23C 14/14* (2013.01); *C23C 14/3414* (2013.01);
(Continued)

(58) Field of Classification Search
CPC ............... H01J 37/3426; H01J 37/3423; H01J 37/3491; H01J 2237/332; C23C 14/14; C23C 14/3414; C23C 14/3407
(Continued)

(56) References Cited

U.S. PATENT DOCUMENTS

2002/0185373 A1* 12/2002 Hara .................... C23C 14/3414
204/298.12
2009/0010792 A1* 1/2009 Yi ...................... H01L 21/76873
419/68

FOREIGN PATENT DOCUMENTS

| JP | 11-61393 | 3/1999 |
| JP | 11-158612 | 6/1999 |

(Continued)

OTHER PUBLICATIONS

International Search Report dated Jul. 28, 2020 in corresponding International PCT Patent Application PCT/JP2020/022829, 2 pgs.
(Continued)

*Primary Examiner* — Rodney G McDonald
(74) *Attorney, Agent, or Firm* — Ohlandt, Greeley and Perle, L.L.P.

(57) ABSTRACT

A ruthenium-based sputtering target having a cast structure, in which a sputter surface of the sputtering target includes at least two or more types of regions, and crystal surfaces in the regions are different from each other, each of the crystal surfaces being specified by a main peak of X-ray diffraction.

8 Claims, 5 Drawing Sheets

(52) U.S. Cl.
CPC ....... *H01J 37/3423* (2013.01); *H01J 37/3491* (2013.01); *H01J 2237/332* (2013.01)

(58) Field of Classification Search
USPC ........................................ 204/298.12, 298.13
See application file for complete search history.

(56) References Cited

FOREIGN PATENT DOCUMENTS

| JP | 2000-178722 | | 6/2000 |
|----|-------------|---|--------|
| JP | 2017-044892 | | 3/2017 |
| WO | WO-2008033192 | * | 3/2008 |

OTHER PUBLICATIONS

International Report on Patentability dated Dec. 28, 2021 for PCT Appl. No. PCT/JP2020/022829.

* cited by examiner

[FIG.1]
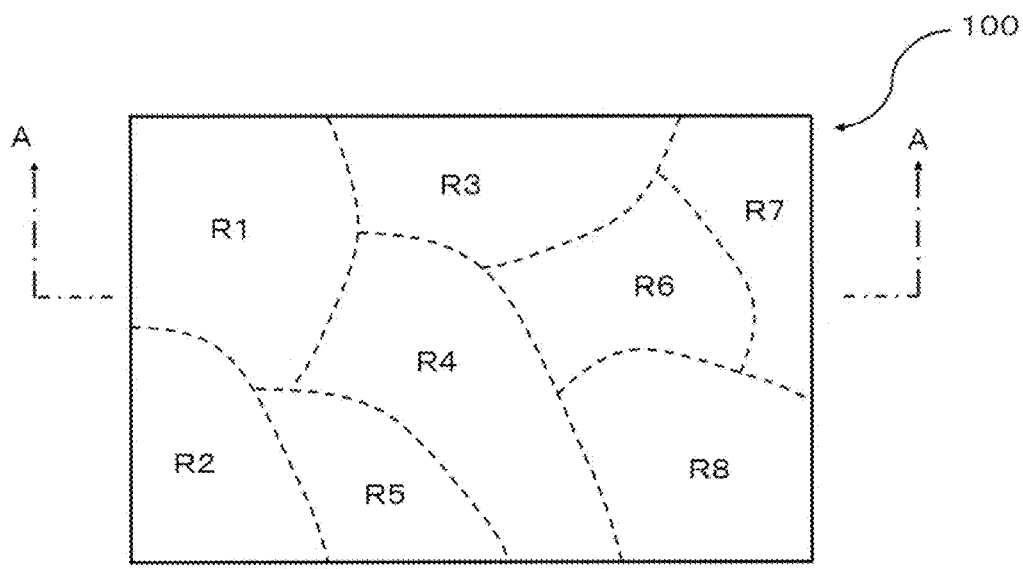
[FIG.2]
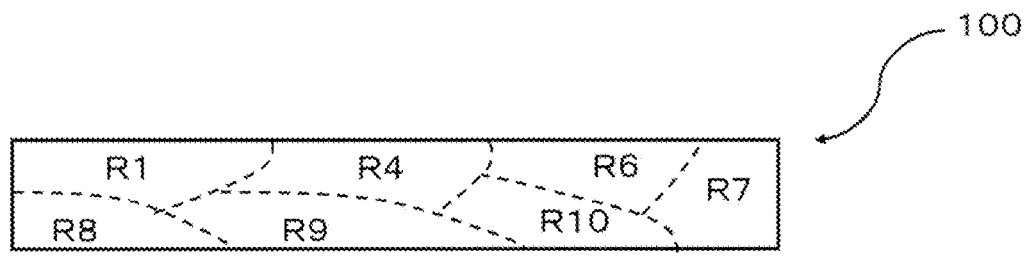

[FIG.3]
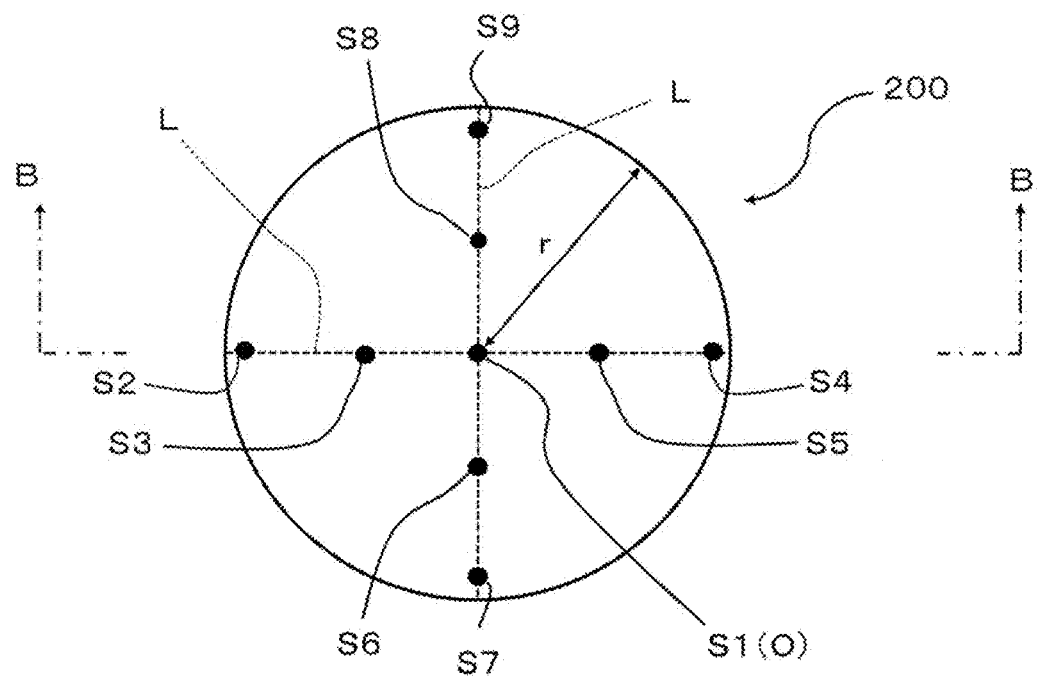
[FIG.4]
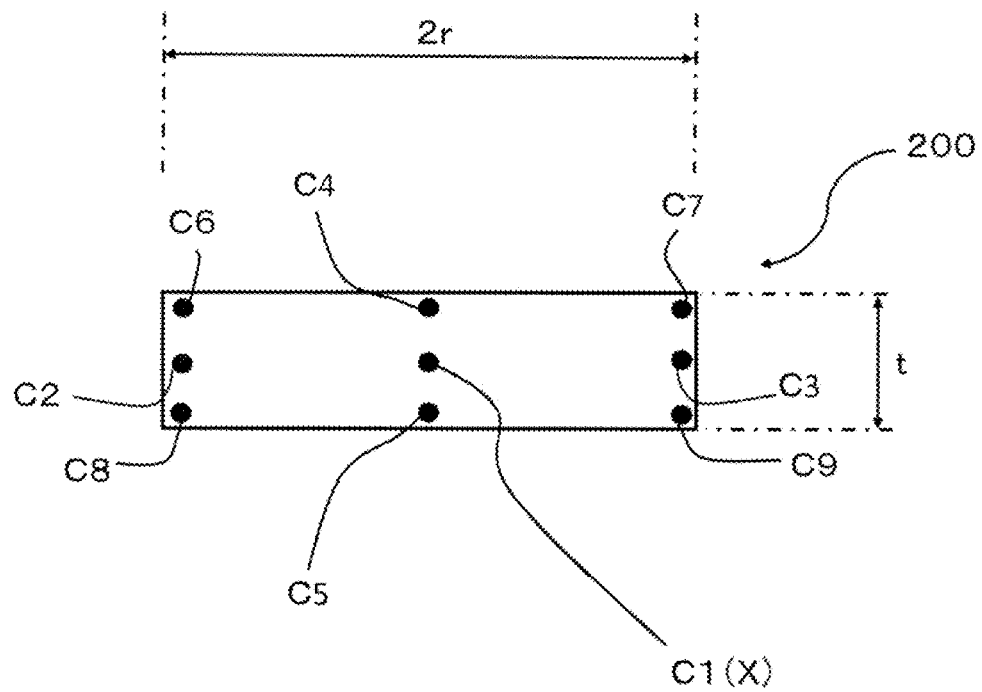

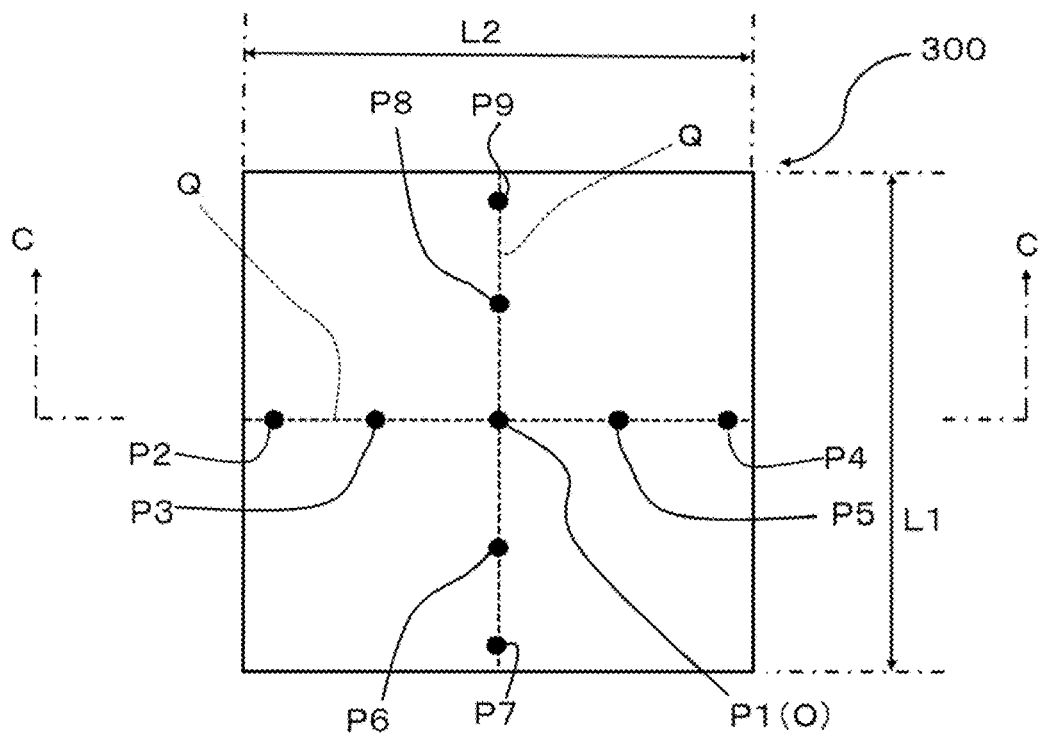
[FIG.5]

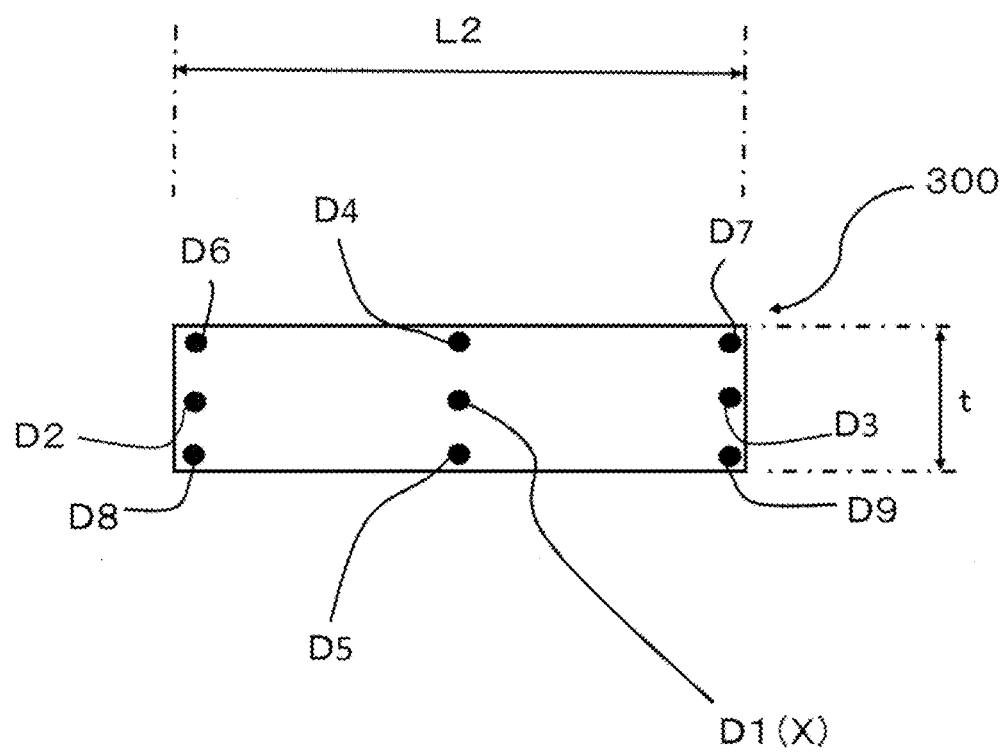
[FIG.6]

[FIG.7]
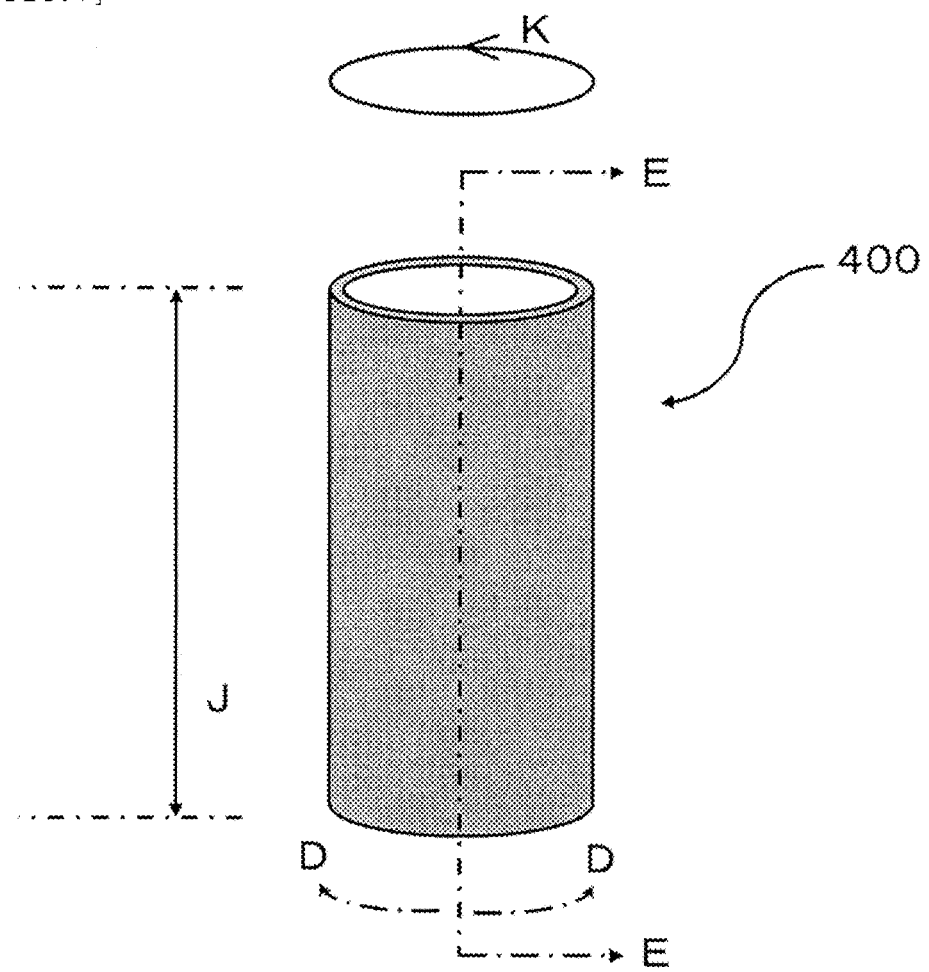

RUTHENIUM-BASED SPUTTERING TARGET AND METHOD FOR MANUFACTURING SAME

BACKGROUND

1. Field of the Disclosure

The present disclosure relates to a ruthenium (Ru)-based sputtering target and its manufacturing method which is used for forming a Ru based thin film as an electrode of a magnetoresistive random access memory (MRAM) that is a non-volatile RAM, or other devices which has been being developed in recent years.

2. Discussion of the Background Art

The thickness of the Ru thin film used for MRAM is extremely thin, namely, several nanometers, and when particles that are impurities adhere to a surface of the film, the product yield is greatly reduced. Therefore, in the fabrication of devices, it is desirable to eliminate the particles as much as possible.

In addition, wafers have been increasing in diameter, and it is currently seen that $\varphi$300 mm wafers are the standard. Then, uniformly sputtering a film on the order of nanometer in a surface of the large-diameter wafer is required. Namely, along with low particle properties that suppress attachment of particles, film thickness uniformity and film density that make the film thickness distribution uniform in the surface, and surface uniformity that makes properties such as microstructure uniform in the surface are also essential to improve the product yield of the Ru film.

Ru has a hexagonal close-packed structure, and it is difficult to process Ru by forging or rolling. Therefore, until now, a manufacturing method such as a powder sintering method has been employed to fabricate a Ru target. However, Ru has a high melting point and requires high energy for sintering, and even when high density processing such as hot isotropic pressing (HIP) is performed, voids in the target are difficult to eliminate. In addition, due to the inclusion of impurities, gasification at high temperature or a sintering defective portion also occurs, thereby causing a reduction in density. In addition, in Ru having a hexagonal close-packed structure, the detachment (chippings) of crystal grains from grain boundaries is likely to occur due to grinding, and numerous chippings are likely to remain on a surface of the target. During sputtering, such voids, impurities, or chippings on the surface of the target become starting points of a kind of abnormal discharge called arcing, and therefore the abnormal discharge is likely to occur. It is known that when arcing occurs, particles are generated.

In addition, extreme ultraviolet lithography (EUV) has been being developed as a next-generation semiconductor lithography technique. In this technique, numerous Ru and Ru alloys are being studied as masking materials of reflective films in lithography (for example, refer to Patent Literature 1). In addition, a development to consider Ru films and Ru alloy films as a wiring material of DRAM has begun. Ru films and the Ru alloy films used for devices, even when these films were obtained by using large-diameter sputtering targets with, for example, a size of more than $\varphi$200 mm in EUV and a size of more than $\varphi$400 mm in DRAM or ReRAM, may require low particle properties, high film thickness uniformity, and high surface uniformity. Ru has a melting point of 2310° C., which belongs to a high melting point group among all metals, and has a relatively high sintering temperature. Therefore, in the existing sintering technique, since it is difficult to achieve a high density of the sputtering target with a size of more than $\varphi$200 mm, numerous voids are likely to remain, and density unevenness is likely to occur in the sputtering target, numerous starting points for the generation of particles are exist, and as a result, low particle properties in the Ru films and the Ru alloy films are difficult to obtain. In addition, since a uniaxial pressing process is generally used in the powder sintering method, the degree of structural anisotropy after sintering is high, and as a result, as sputtering progresses, due to a difference in sputtering rate in a sputter surface, high film thickness uniformity and high surface uniformity are difficult to obtain. In addition, a large-diameter sputtering target may also be obtainable by welding numerous targets obtained by the powder sintering method. However, generally, since gas constituents remain in voids of a sintered body, and during welding, the gas is taken in to cause welding defects, particles are likely to be generated, which is not preferable. In addition, since the sintered body of a base material and a welded portion are significantly different from each other in metallographic structure, it is considered that film thickness uniformity and surface uniformity of the sputter film are reduced due to the difference in sputtering rate.

Therefore, a technique is disclosed in which a molten Ru target is obtained by a melting method instead of the powder sintering method (for example, refer to Patent Literature 2). Further, a technique is disclosed in which ingots are made by repeating melting and solidification twice or more by the melting method, front surfaces and back surfaces of the ingots are ground to make plates, and plural plates are joined together to manufacture a thin flat plate having a large area (for example, refer to Patent Literature 3).

CITATION LIST

Patent Literature

Patent Literature 1: JP 2017-44892 A
Patent Literature 2: JP 2000-178722 A
Patent Literature 3: JP H11-61393 A

SUMMARY

The Problems to be Solved by the Disclosure

According to Patent Literature 2 and Patent Literature 3 that employ the melting method, a sputtering target having a molten and cast structure can be obtained. However, the Ru sputtering target obtained by the melting method has a stronger (002) diffraction peak intensity in X-ray diffraction relative to powder Ru. Namely, the degree of structural anisotropy of the sputtering target is high. Therefore, when a Ru film is formed using the Ru sputtering target obtained by the melting method, low particle properties are obtained, but as sputtering progresses, due to a difference in sputtering rate in a sputter surface, high film thickness uniformity and surface uniformity are difficult to obtain, which is a problem.

Therefore, an object of the present disclosure is to provide a Ru-based sputtering target having no void, having high purity and a low degree of structural anisotropy, and capable of forming a Ru-based film having low particle properties, high film thickness uniformity, and high surface uniformity, and a method for manufacturing the same.

Solution to Solve the Problem

As a result of diligent studies to solve the above problem, the present inventors have found that in a Ru-based sputtering target having a cast structure, the above problem is solved by distributing regions, between which the structural anisotropy of Ru-based crystal grains differs, in an in-plane direction of the target, and have completed the present disclosure. Namely, according to an aspect of the present disclosure, there is provided a ruthenium-based sputtering target having a cast structure, in which a sputter surface of the sputtering target includes at least two or more types of regions, and crystal surfaces in the regions are different from each other, each of the crystal surfaces being specified by a main peak of X-ray diffraction.

In the ruthenium-based sputtering target according to the present disclosure, it is preferable that a side surface of the sputtering target includes at least two or more types of regions, and crystal surfaces in the regions are different from each other, each of the crystal surfaces being specified by a main peak of X-ray diffraction. The target has a low degree of structural anisotropy also in a thickness direction of the target.

In the ruthenium-based sputtering target according to the present disclosure, it is preferable that in (condition 1) or (condition 2), at 40% or more of locations, a sum of relative integrated intensities of a second peak and a third peak of X-ray diffraction in a sputter surface direction or a target thickness direction of the sputtering target is larger than a relative integrated intensity of the main peak. The target has a lower degree of structural anisotropy.

Condition 1

In relation to the sputter surface direction, the sputtering target is a disk-shaped target having a center O and a radius r, and the X-ray diffraction measurement locations are nine locations in grand total including one location at the center O, four locations 0.45r away from the center O in total, and four locations 0.9r away from the center O in total on imaginary crossing lines orthogonal to each other at the center O as a point of intersection.

In relation to the target thickness direction, a cross section is formed which passes through one line of the imaginary crossing lines, the cross section has a rectangular shape having a vertical side of t (namely, a thickness of the target is t) and a horizontal side of 2r, and the X-ray diffraction measurement locations are nine locations in grand total including three locations including a center X and locations 0.45t away upward and downward from the center X on a vertical transversal passing through the center O (referred to as an a-point, an X-point, and a b-point) in total, and two locations 0.9r away from the a-point toward right and left sides in total, two locations 0.9r away from the X-point toward the right and left sides in total, and two locations 0.9r away from the b-point toward the right and left sides in total on the cross section.

Condition 2

In relation to the sputter surface direction, the sputtering target has a rectangular shape having a vertical length L1 and a horizontal length L2 (here, including a square shape in which L1 and L2 are equal. Alternatively, the rectangular shape includes a rectangular shape obtained by developing a side surface of a cylindrical shape having a length J and a circumference K, and in this form, L2 corresponds to the length J, L1 corresponds to the circumference K, and a relationship of J>K, J=K, or J<K is established between the length J and the circumference K), and when imaginary crossing lines are orthogonal to each other at a center of gravity O as a point of intersection, and the imaginary crossing lines are orthogonal to sides of the rectangular shape, the X-ray diffraction measurement locations are nine locations in grand total including one location at the center of gravity O, and two locations away by a distance of 0.25L1 from the center of gravity O in a vertical direction in total, two locations away by a distance of 0.25L2 from the center of gravity O in a horizontal direction in total, two locations away by a distance of 0.45L1 from the center of gravity O in the vertical direction in total, and two locations away by a distance of 0.45L2 from the center of gravity O in the horizontal direction in total on the imaginary crossing lines.

In relation to the target thickness direction, a cross section is formed which passes through a line selected out of the imaginary crossing lines, the line being parallel to one side of a vertical side of L1 and a horizontal side of L2, when the one side is the horizontal side of L2, the cross section has a rectangular shape having a vertical side of t (namely, a thickness of the target is t) and the horizontal side of L2, and the X-ray diffraction measurement locations are nine locations in grand total including three locations including a center X and locations 0.45t away upward and downward from the center X on a vertical transversal passing through the center of gravity O (referred to as an a-point, an X-point, and a b-point) in total, and two locations 0.45L2 away from the a-point toward right and left sides in total, two locations 0.45L2 away from the X-point toward the right and left sides in total, and two locations 0.45L2 away from the b-point toward the right and left sides in total on the cross section.

In the ruthenium-based sputtering target according to the present disclosure, it is preferable that in (condition 1) or (condition 2), at 75% or more of the locations, a sum of relative integrated intensities of the second peak, the third peak, and a fourth peak of the X-ray diffraction in the sputter surface direction or the target thickness direction of the sputtering target is larger than the relative integrated intensity of the main peak. The target has a lower degree of structural anisotropy.

In the ruthenium-based sputtering target according to the present disclosure, it is preferable that in (condition 1) or (condition 2), a ratio [(101)/(002)] between the number of measurement locations where (002) of the X-ray diffraction in the sputter surface direction or the target thickness direction of the sputtering target is the main peak of the relative integrated intensity and the number of measurement locations where (101) is the main peak of the relative integrated intensity is in a range of 20/100 to 70/100. The target has a lower degree of structural anisotropy.

In the ruthenium-based sputtering target according to the present disclosure, it is preferable that in (condition 1) or (condition 2), a ratio [(103)/(002)] between the number of measurement locations where (002) of the X-ray diffraction in the sputter surface direction of the sputtering target is the main peak of the relative integrated intensity and the number of measurement locations where (103) is the main peak of the relative integrated intensity is in a range of 10/100 to 40/100. The target has a lower degree of structural anisotropy.

In the ruthenium-based sputtering target according to the present disclosure, it is preferable that in (condition 1) or (condition 2), a ratio [(112)/(002)] between the number of measurement locations where (002) of the X-ray diffraction in the sputter surface direction of the sputtering target is the main peak of the relative integrated intensity and the number of measurement locations where (112) is the main peak of the relative integrated intensity is in a range of 10/100 to 30/100. The target has a lower degree of structural anisotropy.

In the ruthenium-based sputtering target according to the present disclosure, it is preferable that in (condition 1) or (condition 2), a ratio [(110)/(002)] between the number of measurement locations where (002) of the X-ray diffraction in the target thickness direction of the sputtering target is the main peak of the relative integrated intensity and the number of measurement locations where (110) is the main peak of the relative integrated intensity is in a range of 15/100 to 50/100. The target has a lower degree of structural anisotropy.

In the ruthenium-based sputtering target according to the present disclosure, it is preferable that a shape of the target is a cylindrical shape, a disk shape having φ250 mm or more, a rectangular plate shape having at least one side of 250 mm or more, or a square plate shape having a side of 250 mm or more, and the ruthenium-based sputtering target includes a welded portion or a friction stir welding portion.

According to an aspect of the present disclosure, there is provided a method for manufacturing a ruthenium-based sputtering target, the method including: at least a first step of placing a ruthenium-based raw material on a seed plate containing ruthenium-based random anisotropic crystals, melting the ruthenium-based raw material without breaking down a shape of the seed plate, and thereafter performing cooling to obtain a plate thicker than the seed plate; and a second step of placing the ruthenium-based raw material on the plate obtained in the first step, melting the ruthenium-based raw material without breaking down a shape of the plate, and thereafter performing cooling to obtain a thick plate that is much thicker than the plate.

Advantageous Effects of Disclosure

According to the present disclosure, it is possible to provide the Ru-based sputtering target having no void, having high purity and a low degree of structural anisotropy, and capable of forming a Ru-based film having low particle properties, high film thickness uniformity, and high surface uniformity, and the method for manufacturing the same.

BRIEF DESCRIPTION OF THE DRAWINGS

FIG. 1 is a view for describing a concept of regions on a sputter surface of a ruthenium-based sputtering target according to the present embodiment.

FIG. 2 is a view for describing a concept of regions in an A-A cross section.

FIG. 3 is a schematic view showing X-ray diffraction measurement locations in a sputter surface direction of a disk-shaped target.

FIG. 4 is a schematic view showing X-ray diffraction measurement locations in a target thickness direction of the disk-shaped target shown in a B-B cross section.

FIG. 5 is a schematic view showing X-ray diffraction measurement locations in a sputter surface direction of a square plate-shaped target.

FIG. 6 is a schematic view showing X-ray diffraction measurement locations in a target thickness direction of the square plate-shaped target shown in a C-C cross section.

FIG. 7 is a conceptual view for describing measurement locations of a cylindrical target.

DETAILED DESCRIPTION OF THE PREFERRED EMBODIMENT

Hereinafter, the present disclosure will be described in detail based on an embodiment, but the present disclosure is not interpreted as being limited to the description thereof. The embodiment may be modified in various forms as long as effects of the present disclosure are exhibited.

A ruthenium-based sputtering target according to the present embodiment is a ruthenium-based sputtering target having a cast structure, in which a sputter surface of the sputtering target includes at least two or more types of regions, and crystal surfaces in the regions are different from each other, each of the crystal surfaces being specified by a main peak of X-ray diffraction. Since the ruthenium-based sputtering target according to the present embodiment is a target obtained by a so-called melting method, the ruthenium-based sputtering target has a cast structure, and has less voids and higher purity than a target obtained by a powder sintering method. The number of voids is, for example, one or less when a field of view of 50 mm×50 mm is observed under a microscope. In addition, regarding purity, a content of gas elements is extremely low, for example, the content of gas elements such as oxygen, nitrogen and hydrogen is less than 50 ppm. Then, since the target is not processed by forging or rolling and the shape of the target is trimmed by grinding a surface thereof, the target has a cast structure.

Next, a concept of "regions" will be described with reference to FIG. 1. First, in FIG. 1, regions R1 to R8 on a sputter surface are shown. The boundary of each region is shown by a dotted line, but it is not meant that clear boundary lines in the ruthenium-based sputtering target according to the present embodiment can be visually seen. In a ruthenium-based sputtering target 100 according to the present embodiment, when measurement by X-ray diffraction is performed at different locations in a sputter surface, several crystal surfaces specified by main peaks of X-ray diffraction (hereinafter, may be referred to simply as crystal surfaces) appear. A portion surrounding an area in which a crystal surface of the same type appears is, for example, the region R1, and a portion surrounding an area, in which a crystal surface different from the crystal surface in the region R1 appears, adjacent to the region R1 is, for example, the region R3. Similarly, a portion surrounding an area, in which a crystal surface different from the crystal surface in the region R3 appears, adjacent to the region R3, is, for example, the region R7. The same relationship is also established among the regions R2, R4, R5, R6, and R8. The boundary of each of the regions R1 to R8 merely indicates that two crystal surfaces interposing the boundary are different from each other, and it is meant that not all the crystal surfaces of the regions R1 to R8 are different from each other, namely, eight main peaks do not always appear. For example, speaking of the relationship among the regions R1, region R3, and the region R7, a form is included in which the crystal surfaces of the region R1 and the region R7 are the same type. In this regard, the same relationship is also established among the regions R2, R4, R5, R6, and R8. As described above, the regions R1 to R8 on the sputter surface are hypothetical regions partitioned off according to the types of the crystal surfaces, and are regions in which the crystal surfaces specified by the main peaks of X-ray diffraction are different from each other. In the ruthenium-based sputtering target fabricated by the melting method in the related process, even when measurement by X-ray diffraction is performed on each sputter surface, crystal surfaces having the same main peak (hkl) can be obtained. Specifically, (002) can be obtained. For example, also in paragraph 0014 of the specification of Patent Literature 2, a (002) diffraction peak is measured. Meanwhile, as described in the conceptual view of FIG. 1, in the ruthenium-based sputtering target according to the present embodiment, the sputter surface includes at least two or more types of regions, and the crystal surfaces in the regions are different from each other, each of the crystal surfaces being specified by the main peak of X-ray diffraction. Incidentally, in FIG. 1, eight regions R1 to R8 on the sputter surface are shown, and are provided as an example, and the present embodiment is not limited to the form of FIG. 1.

In the present embodiment, the composition of the ruthenium-based sputtering target is ruthenium or a ruthenium alloy. In both cases, gas elements are preferably 50 ppm or less and more preferably 30 ppm or less. In addition, the ruthenium alloy is, for example, a Ru—Nb alloy, a Ru—Zr alloy, or a Ru—B alloy. Regarding the content rate of a metal such as Nb, Zr, or B other than Ru in the ruthenium alloy, in the case of the Ru—Nb alloy, the Nb element is preferably 40 atom % or less in metal element ratio and more preferably 30 atom % or less. The lower limit of the content rate of the Nb element is, for example, 0.1 atom %. In the case of the Ru—Zr alloy, the Zr element is preferably 40 atom % or less in metal element ratio and more preferably 30 atom % or less. The lower limit of the content rate of the Zr element is, for example, 0.1 atom %. In the case of the Ru—B alloy, the B element is preferably 40 atom % or less in metal element ratio and more preferably 30 atom or less. The lower limit of the content rate of the B element is, for example, 0.1 atom %.

In the present embodiment, the concept of the main peak in X-ray diffraction is as follows. The ruthenium has a hexagonal close-packed structure, and at least a main peak, a second peak, a third peak, and a fourth peak appear. In each of the regions R1 to R8 on the sputter surface, a plurality of crystal grains (all having a hexagonal close-packed structure) are exposed, and orientations of the crystal grains are not unidirectional, so that the main peak is determined by the sum of the peaks of X-ray diffraction based on the crystal grains. Namely, a direction in which the majority of the crystal grains in each region face can be determined by information regarding the main peak.

In the present embodiment, it is preferable that a side surface of the sputtering target includes at least two or more types of regions, and crystal surfaces in the regions are different from each other, each of the crystal surfaces being specified by the main peak of X-ray diffraction. A concept of "regions" in a side surface of the sputtering target 100 will be described with reference to FIG. 2. Here, since the side surfaces of the sputtering target are usually trimmed by grinding, the side surface of the sputtering target corresponds to a "cross section" with reference to the target before grinding. An A-A cross section in FIG. 1 will be described as an example of the side surface of the sputtering target. In FIG. 2, regions R1, R4, and R6 to R10 on the side surface (cross section) are shown. Similarly to the case of FIG. 1, a boundary of each region is shown by a dotted line, but it is not meant that clear boundary lines can be visually seen. In the ruthenium-based sputtering target according to the present embodiment, when measurement by X-ray diffraction is performed at different locations in the side surface, several crystal surfaces specified by main peaks of X-ray diffraction (hereinafter, may be referred to simply as crystal surfaces) appear. A portion surrounding an area in which a crystal surface of the same type appears is, for example, the region R1, and a portion surrounding an area, in which a crystal surface different from the crystal surface in the region R1 appears, adjacent to the region R1 is, for example, the region R4. Similarly, a portion surrounding an area, in which a crystal surface different from the crystal surface in the region R4 appears, adjacent to the region R4 is, for example, the region R6. The same relationship is also established among the regions R7 to R10. The boundary of each of the regions R1, R4, and R6 to R10 merely indicates that two crystal surfaces interposing the boundary are different from each other, and it is meant that not all the crystal surfaces of the regions R1, R4, and R6 to R10 are different from each other, namely, seven main peaks do not always appear. The concept of the crystal surface of each region is the same as the case of the regions R1 to R8 in the sputter surface. Incidentally, in FIG. 2, seven regions R1, R4, and R6 to R10 on the side surface are shown, and are provided as an example, and the present embodiment is not limited to the form of FIG. 2.

In the present embodiment, for example, a case where measurement by X-ray diffraction is performed at least two locations of the sputter surface, and two or more types of crystal surfaces specified by main peaks of X-ray diffraction appear corresponds to a case where the sputter surface of the sputtering target includes at least two or more types of regions, and the crystal surfaces in the regions are different from each other, each of the crystal surface being specified by the main peak of X-ray diffraction. Similarly, a case where measurement by X-ray diffraction is performed at least two locations of the side surface of the target, and two or more types of crystal surfaces specified by main peaks of X-ray diffraction appear corresponds to a case where the side surface of the sputtering target includes at least two or more types of regions, and the crystal surfaces in the regions are different from each other, each of the crystal surfaces being specified by the main peak of X-ray diffraction.

In the present embodiment, in the sputtering target, in order to facilitate determining whether or not two or more types of crystal surfaces specified by main peaks of X-ray diffraction appear, a determination may be made by whether or not the following (condition 1) and (condition 2) are satisfied in X-ray diffraction.

Condition 1

(Sputter Surface Direction)

FIG. 3 shows X-ray diffraction measurement locations in a sputter surface direction of a disk-shaped target. A sputtering target 200 is a disk-shaped target having a center O and a radius r. The X-ray diffraction measurement locations are nine locations in grand total including one location (S1) at the center O four locations 0.45r away from the center O (S3, S5, S6, and S8) in total, and four locations 0.9r away from the center O (S2, S4, S7, and S9) in total on imaginary crossing lines (L) orthogonal to each other at the center O as a point of intersection.

(Target Thickness Direction)

FIG. 4 shows X-ray diffraction measurement locations in a target thickness direction of the disk-shaped target 200 shown in a B-B cross section. A cross section is formed which passes through one line of the imaginary crossing lines (L) shown in FIG. 3. The cross section has a rectangular shape having a vertical side of t (namely, the thickness of the target is t) and a horizontal side of 2r. Then, the X-ray diffraction measurement locations are nine measurement points in grand total including three locations including a center X (C1) and locations 0.45t away upward and downward from the center X on a vertical transversal passing through the center O shown in FIG. 3 (referred to as a-point (C4), X-point (C1), and b-point (C5)) in total, and two locations 0.9r away from the a-point toward right and left sides (C6 and C7) in total, two locations 0.9r away from the X-point toward the right and left sides (C2 and C3) in total, and two locations 0.9r away from the b-point toward the right and left sides (C8 and C9) in total on the cross section.

Condition 2

(Sputter Surface Direction)

The sputtering target is a rectangular target having a vertical length L1 and a horizontal length L2 (here, including a square shape in which L1 and L2 are equal). A description will be given with reference to FIG. 5. FIG. 5 shows a form of a sputtering target 300 in which L1 is equal to L2. When imaginary crossing lines (Q) are orthogonal to each other at a center of gravity O as a point of intersection, and the imaginary crossing lines are orthogonal to sides of the rectangular shape (or square shape), X-ray diffraction measurement locations are nine locations in grand total including one location at the center of gravity O (P1), and two locations away by a distance of 0.25L1 from the center of gravity O in a vertical direction (P6 and P8) in total, two locations away by a distance of 0.25L2 from the center of gravity O in a horizontal direction (P3 and P5) in total, two locations away by a distance of 0.45L1 from the center of gravity O in the vertical direction (P7 and P9) in total, and two locations away by a distance of 0.45L2 from the center of gravity O in the horizontal direction (P2 and P4) in total on the imaginary crossing lines.

Incidentally, when the sputtering target has a rectangular shape, L1 and L2 can be appropriately selected regardless of the lengths of the sides.

(Target thickness direction)

FIG. 6 shows X-ray diffraction measurement locations in a target thickness direction of the plate-shaped target 300 shown in a C-C cross section. A cross section is formed which passes through a line parallel to L2 (here, the lengths L1 and L2 are equal in FIG. 5) selected out of the imaginary crossing lines (Q) shown in FIG. 5. FIG. 6 shows a cross section along a line parallel to L2 and passing through the center of gravity O in FIG. 5. The cross section has a rectangular shape having a vertical side of t (namely, the thickness of the target is t) and a horizontal side of L2, and the X-ray diffraction measurement locations are nine measurement points in grand total including three locations including a center X (D1) and locations 0.45t away upward and downward from the center X on a vertical transversal passing through the center of gravity O (referred to as a-point (D4), X-point (D1), and b-point (D5)) in total, and two locations 0.45L2 away from the a-point toward right and left sides (D6 and D7) in total, two locations 0.45L2 away from the X-point toward the right and left sides (D2 and D3) in total, and two locations 0.45L2 away from the b-point toward the right and left sides (D8 and D9) in total on the cross section.

(Cylindrical Sputtering Target)

In the case of the sputtering target having a cylindrical shape, since a side surface of the cylinder is a sputter surface and a developed view has a rectangular shape (including a square shape), it can be considered that (condition 1) and (condition 2) are the same as the case of FIG. 5 and FIG. 6. The rectangular shape includes a rectangular shape obtained by developing a side surface of a cylindrical shape having a length J and a circumference K, and in this form, L2 corresponds to the length J, L1 corresponds to the circumference K, and the relationship of J>K, J=K, or J<K is established between the length J and the circumference K. FIG. 7 is a conceptual view for describing measurement locations of a cylindrical target 400. When the sputtering target 400 has a cylindrical shape having the height (length) J and the body circumference K, an E-E cross section and a D-D developed surface in which the cross section is at both ends are considered. First, it is considered that X-ray diffraction measurement locations in a target thickness direction in the E-E cross section are the same as in FIG. 6. Namely, the X-ray diffraction measurement locations are based on the consideration that the height J of the cylindrical material corresponds to L2 in FIG. 6 and the thickness of the cylindrical material corresponds to the thickness t in FIG. 6. In addition, it is considered that X-ray diffraction measurement locations in a sputter surface direction in the D-D developed surface are the same as in FIG. 5. Namely, the X-ray diffraction measurement locations are based on the consideration that the height J of the cylindrical material corresponds to L2 in FIG. 5 (here, the lengths L1 and L2 are equal in FIG. 5) and the body circumference K of the cylindrical material corresponds to L1 in FIG. 5.

In the present embodiment, it is preferable that the shape of the target is a cylindrical shape, a disk shape having φ250 mm or more, a rectangular plate shape having at least one side of 250 mm or more, or a square plate shape having a side of 250 mm or more, and the target includes a welded portion or a friction stir welding portion. A Ru-based film having low particle properties, high film thickness uniformity, and high surface uniformity can also be formed on a large-sized target. When the shape of the target is a cylindrical shape, it is preferable that for example, the height is from 500 to 2500 mm and the radius of the circle in a cross section is from 100 to 200 mm. The welded portion is formed when target plates are processed into a large-sized cylindrical member by welding, and it is preferable that the welded portion is formed by electron beam welding or arc welding. Similarly, the friction stir welding portion is also formed when target plates are processed into a large-sized cylindrical member by welding, and it is preferable that the friction stir welding portion is formed by friction stir welding. For example, the technique described in JP 6491859 B2 may be applied.

It is preferable that the Ru-based sputtering target according to the present embodiment has an intensity relationship between peaks of the X-ray diffraction in (condition 1) or (condition 2), in that the degree of structural anisotropy in the target is low. When at least one of the following (1) to (6) is satisfied, it can be said that the degree of structural anisotropy is low.

(1) At 40% or more of locations, a sum of relative integrated intensities of the second peak and the third peak of the X-ray diffraction in the sputter surface direction or the target thickness direction of the sputtering target is larger than the relative integrated intensity of the main peak.

(2) At 75% or more of locations, a sum of relative integrated intensities of the second peak, the third peak, and the fourth peak of the X-ray diffraction in the sputter surface direction or the target thickness direction of the sputtering target is larger than the relative integrated intensity of the main peak.

(3) A ratio [(101)/(002)] between the number of measurement locations where (002) of the X-ray diffraction in the sputter surface direction or the target thickness direction of the sputtering target is the main peak of the relative integrated intensity and the number of measurement locations where (101) is the main peak of the relative integrated intensity is in a range of 20/100 to 70/100.

(4) A ratio [(103)/(002)] between the number of measurement locations where (002) of the X-ray diffraction in the sputter surface direction of the sputtering target is the main peak of the relative integrated intensity and the number of measurement locations where (103) is the main peak of the relative integrated intensity is in a range of 10/100 to 40/100.

(5) A ratio [(112)/(002)] between the number of measurement locations where (002) of the X-ray diffraction in the sputter surface direction of the sputtering target is the main peak of the relative integrated intensity and the number of measurement locations where (112) is the main peak of the relative integrated intensity is in a range of 10/100 to 30/100.

(6) A ratio [(110)/(002)] between the number of measurement locations where (002) of the X-ray diffraction in the target thickness direction of the sputtering target is the main peak of the relative integrated intensity and the number of measurement locations where (110) is the main peak of the relative integrated intensity is in a range of 15/100 to 50/100.

(Method for Manufacturing Ru-Based Sputtering Target)

A method for manufacturing the Ru-based sputtering target according to the present embodiment includes at least a first step of placing a ruthenium-based raw material on a seed plate containing ruthenium-based random anisotropic crystals, melting the ruthenium-based raw material without breaking down a shape of the seed plate, and thereafter performing cooling to obtain a plate thicker than the seed plate, and a second step of placing the ruthenium-based raw material on the plate obtained in the first step, melting the ruthenium-based raw material without breaking down a shape of the plate, and thereafter performing cooling to obtain a thick plate that is much thicker than the plate. Following the second step, a third step of placing the ruthenium-based raw material on the plate obtained in the second step, melting the ruthenium-based raw material without breaking down a shape of the thick plate, and thereafter performing cooling to obtain a plate much thicker than the thick plate may be included, and the same step as the third step may be further repeated a plurality of times. In the first step, the partial melting of the seed plate is allowed since the shape of the seed plate is not to be broken down, but it is preferable that melting of the seed plate is not performed. In the second and subsequent steps, the partial melting of each plate is allowed since the shape of each plate is not to be broken down, but it is preferable that melting of each plate is not performed. Hereinafter, a description will be given in detail.

[Fabrication of Seed Plate Containing Ruthenium-Based Random Anisotropic Crystals]

A seed plate made of a ruthenium metal or a ruthenium alloy having the same composition as that of the Ru-based sputtering target to be fabricated is prepared. In the case of the ruthenium metal, the seed plate is a seed plate containing random anisotropic crystals having a hexagonal close-packed structure, while in the case of the ruthenium alloy, the seed plate is a seed plate containing random anisotropic crystals. In the process for fabricating the seed plate containing ruthenium-based random anisotropic crystals, cast ruthenium metal pieces or cast ruthenium alloy pieces (hereinafter, referred to as cast ruthenium pieces), which have the same composition as that of the Ru-based sputtering target to be fabricated, are arranged flatly on a base, and semi-melted and thereafter cooled to fabricate a ruthenium-based plate. Next, cast ruthenium pieces are arranged flatly on the ruthenium-based plate, and semi-melted and thereafter cooled to fabricate a laminated ruthenium-based plate. A multi-layer ruthenium-based plate is fabricated by repeating this lamination step as required. Then, a surface of the multi-layer ruthenium-based plate is ground into a flat surface to obtain ruthenium-based random anisotropic crystals. The method for manufacturing the seed plate is provided as an example, and the seed plate containing random anisotropic crystals may be prepared by other methods. The "semi-melting" in this step means that upper portions of the cast ruthenium pieces are melted by heating from above the base and lower portions are maintained in a non-molten state before sufficient heat is conducted. Since the upper portions of the cast ruthenium pieces are melted, a melt of the molten ruthenium pieces flows downward and gaps between the cast ruthenium pieces are filled with the melt, so that a plate with no gap in an in-plane direction is formed. Since the lower portions of the cast ruthenium pieces are not melted, the crystal orientation differs between a portion of the cast ruthenium piece and a portion in which the melt is solidified. Since the upper portions of the cast ruthenium pieces are melted but the cast ruthenium pieces are not entirely melted, the surface of the seed plate after semi-melting but before grinding is a surface in which a part of the shapes of the cast ruthenium pieces remains.

[Ruthenium-Based Raw Material]

As the ruthenium-based raw material, cast ruthenium pieces having a desired composition of the Ru-based sputtering target are provided. The ruthenium-based raw material can be obtained, for example, by primarily melting ruthenium or a ruthenium alloy for the purpose of degassing, fabricating a solidified product, and then crushing the solidified product into fragments.

[Melting Step]

A ruthenium-based plate including the seed plate in a lower portion is fabricated by arranging the fragments, which are provided as the ruthenium-based raw material, flatly on the seed plate containing ruthenium-based random anisotropic crystals, and melting and thereafter cooling the fragments. Next, a laminated ruthenium-based plate including the seed plate in a lower portion is fabricated by arranging the cast ruthenium-based pieces flatly on the ruthenium-based plate including the seed plate in the lower portion, and melting and thereafter cooling the cast ruthenium-based pieces. A multi-layer ruthenium-based plate including the seed plate in a lower portion is fabricated by repeating this lamination step as required. Then, the Ru-based sputtering target is obtained by cutting the seed plate, which is located in the lower portion, off from the multi-layer ruthenium-based plate including the seed plate in the lower portion, and further grinding a surface opposite a surface, from which the seed plate is cut off, into a flat surface.

It is preferable that the cutoff seed plate is reused. The same Ru-based sputtering targets can be reproduced by using the same seed plate.

EXAMPLES

Hereinafter, the present disclosure will be described in further detail based on Examples, but the present disclosure is not interpreted as being limited to the Examples.

Example 1

A seed plate made of a ruthenium metal and containing random anisotropic crystals having a hexagonal close-packed structure was prepared. In addition, a ruthenium raw material was prepared. A ruthenium ingot was obtained by solidifying molten ruthenium, which was provided by melting ruthenium powder (purity 99.99% by mass) in a vacuum atmosphere of $5\times10^{-2}$ Pa or less. The ruthenium ingot was crushed into crushed products, and the crushed products were used as the ruthenium raw material. As the ruthenium raw material, cast ruthenium pieces were provided. A ruthenium plate including the seed plate in a lower portion was fabricated by arranging the crushed products, which were provided as the ruthenium raw material, flatly on the seed plate, melting each fragment in a vacuum atmosphere of $5\times10^{-2}$ Pa or less by means of heating from above, and thereafter cooling the fragments. Next, a laminated ruthenium plate including the seed plate in a lower portion was fabricated by arranging the cast ruthenium pieces flatly on the ruthenium plate including the seed plate in the lower portion, melting each fragment in a vacuum atmosphere of $5\times10^{-2}$ Pa or less by means of heating from above, and thereafter cooling the fragments. Next, a square plate-shaped Ru sputtering target having a vertical side and a horizontal side of 250 mm and a thickness of 20 mm was fabricated by cutting the seed plate, which was located in the lower portion, off from the multi-layer ruthenium-based plate including the seed plate in the lower portion, and further grinding a surface opposite a surface, from which the seed plate was cut off, into a flat surface.

Comparative Example 1

A ruthenium ingot was obtained by solidifying molten ruthenium, which was provided by melting ruthenium powder (purity 99.99% by mass) in an argon atmosphere of 0.05 MPa to 0.1 MPa by means of arc melting. A square plate-shaped Ru sputtering target having a vertical side and a horizontal side of 150 mm and a thickness of 10 mm was obtained by grinding the ingot.

Comparative Example 2

A square plate-shaped Ru sputtering target having a vertical side and a horizontal side of 200 mm and a thickness of 10 mm was obtained by hot-pressing ruthenium powder (purity 99.99% by mass) under a condition where the temperature was 1600° C., the temperature was held for eight hours, and the pressure was 30 MPa to fabricate a sintered body, and grinding the sintered body.

Reference Example 1

Ruthenium powder (purity 99.99% by mass) was used as a reference example.

(X-Ray Diffraction)

Measurement by X-ray diffraction (CuKα) was performed on each of the square plate-shaped Ru sputtering targets of Example 1 and Comparative Examples 1 and 2 according to (condition 2). In Example 1, the crystal surfaces and the relative integrated intensities of peaks for the main peak, the second peak, the third peak, and the fourth peak were summarized in Table 1 and Table 2. P1 to P9 in Table 1 correspond to P1 to P9 in FIG. 5. In addition, D1 to D9 in Table 2 corresponds to D1 to D9 in FIG. 6. In Comparative Example 1, since the crystal surfaces and the relative integrated intensities of peaks for the main peak, the second peak, the third peak, and the fourth peak were not changed depending on the measurement locations P1 to P9 in FIG. 5 and D1 to D9 in FIG. 6, a result of the locations indicated by P1 in FIG. 5 and D1 in FIG. 6 was shown in Table 3. In Comparative Example 2, since the crystal surfaces and the relative integrated intensities of peaks for the main peak, the second peak, the third peak, and the fourth peak were not changed depending on the measurement locations P1 to P9 in FIG. 5 and D1 to D9 in FIG. 6, a result of the locations indicated by P1 in FIG. 5 and D1 in FIG. 6 was shown in Table 4. In Reference Example 1, the crystal surfaces and the relative integrated intensities of peaks for the main peak, the second peak, the third peak, and the fourth peak were summarized in Table 5.

TABLE 1

| Example 1 | Main peak | | Second peak | | Third peak | | Fourth peak | | Sum of second and third peaks | Sum of second, third, and fourth peaks |
| --- | --- | --- | --- | --- | --- | --- | --- | --- | --- | --- |
| | Crystal surface name | Relative integrated intensity | Crystal surface name | Relative integrated intensity | Crystal surface name | Relative integrated intensity | Crystal surface name | Relative integrated intensity | | |
| P 1 | (1, 0, 1) | 100 | (0, 0, 2) | 59.09 | (1, 0, 2) | 46.76 | (1, 0, 3) | 33.95 | 105.85 | 139.80 |
| P 2 | (0, 0, 2) | 100 | (1, 0, 1) | 87.73 | (1, 0, 2) | 51.50 | (1, 0, 3) | 47.65 | 139.23 | 186.88 |
| P 3 | (0, 0, 2) | 100 | (1, 0, 1) | 44.87 | (1, 0, 3) | 34.66 | (1, 0, 2) | 27.55 | 79.53 | 107.08 |
| P 4 | (0, 0, 2) | 100 | (1, 0, 3) | 47.61 | (1, 0, 1) | 33.49 | (1, 0, 2) | 32.57 | 81.10 | 113.67 |
| P 5 | (0, 0, 2) | 100 | (1, 0, 3) | 60.33 | (1, 0, 1) | 45.37 | (1, 1, 2) | 41.72 | 105.70 | 147.42 |
| P 6 | (1, 0, 1) | 100 | (0, 0, 2) | 61.41 | (1, 0, 2) | 37.92 | (1, 0, 3) | 27.89 | 99.33 | 127.22 |
| P 7 | (1, 0, 3) | 100 | (0, 0, 2) | 53.92 | (1, 0, 1) | 28.21 | (1, 0, 2) | 12.16 | 82.13 | 94.29 |
| P 8 | (1, 1, 2) | 100 | (0, 0, 2) | 85.95 | (1, 0, 1) | 52.94 | (1, 0, 3) | 35.77 | 138.89 | 174.66 |
| P 9 | (0, 0, 2) | 100 | (1, 0, 3) | 55.31 | (1, 0, 2) | 27.27 | (1, 0, 1) | 26.98 | 82.58 | 109.56 |

TABLE 2

| Example 1 | Main peak | | Second peak | | Third peak | | Fourth peak | | Sum of second and third peaks | Sum of second, third, and fourth peaks |
| --- | --- | --- | --- | --- | --- | --- | --- | --- | --- | --- |
| | Crystal surface name | Relative integrated intensity | Crystal surface name | Relative integrated intensity | Crystal surface name | Relative integrated intensity | Crystal surface name | Relative integrated intensity | | |
| D1 | (0, 0, 2) | 100 | (1, 0, 1) | 63.87 | (1, 0, 0) | 51.85 | (1, 1, 0) | 48.35 | 115.72 | 164.07 |
| D2 | (0, 0, 2) | 100 | (1, 0, 0) | 9.21 | (1, 0, 1) | 7.91 | (1, 1, 0) | 2.46 | 17.12 | 19.58 |
| D3 | (1, 0, 1) | 100 | (1, 0, 3) | 88.48 | (1, 1, 0) | 66.09 | (0, 0, 2) | 55.05 | 154.57 | 209.62 |

TABLE 2-continued

| Example 1 | Main peak | | Second peak | | Third peak | | Fourth peak | | Sum of second and third peaks | Sum of second, third, and fourth peaks |
|---|---|---|---|---|---|---|---|---|---|---|
| | Crystal surface name | Relative integrated intensity | Crystal surface name | Relative integrated intensity | Crystal surface name | Relative integrated intensity | Crystal surface name | Relative integrated intensity | | |
| D4 | (0, 0, 2) | 100 | (1, 0, 0) | 22.83 | (1, 0, 1) | 8.02 | (2, 0, 0) | 4.54 | 30.85 | 35.39 |
| D5 | (1, 1, 0) | 100 | (0, 0, 2) | 45.35 | (1, 0, 1) | 40.78 | (1, 0, 0) | 24.31 | 86.13 | 110.44 |
| D6 | (1, 1, 0) | 100 | (0, 0, 2) | 80.41 | (1, 0, 1) | 51.27 | (1, 0, 3) | 37.31 | 131.68 | 168.99 |
| D7 | (0, 0, 2) | 100 | (1, 0, 1) | 60.31 | (1, 0, 3) | 43.97 | (1, 0, 0) | 26.66 | 104.28 | 130.94 |
| D8 | (1, 0, 1) | 100 | (0, 0, 2) | 71.80 | (1, 0, 3) | 36.05 | (1, 0, 0) | 20.86 | 107.85 | 128.71 |
| D9 | (0, 0, 2) | 100 | (1, 0, 1) | 75.89 | (1, 0, 3) | 38.45 | (1, 0, 0) | 19.83 | 114.34 | 134.17 |

TABLE 3

| Comparative Example 1 | Main peak | | Second peak | | Third peak | | Fourth peak | | Sum of second and third peaks | Sum of second, third, and fourth peaks |
|---|---|---|---|---|---|---|---|---|---|---|
| | Crystal surface name | Relative integrated intensity | Crystal surface name | Relative integrated intensity | Crystal surface name | Relative integrated intensity | Crystal surface name | Relative integrated intensity | | |
| P 1 | (0, 0, 2) | 100 | (1, 0, 1) | 16.58 | (1, 0, 2) | 15.21 | (1, 0, 3) | 7.98 | 31.79 | 39.77 |
| D 1 | (0, 0, 2) | 100 | (1, 0, 1) | 51.51 | (2, 0, 1) | 11.20 | (0, 0, 4) | 10.82 | 62.71 | 73.53 |

TABLE 4

| Comparative Example 2 | Main peak | | Second peak | | Third peak | | Fourth peak | | Sum of second and third peaks | Sum of second, third, and fourth peaks |
|---|---|---|---|---|---|---|---|---|---|---|
| | Crystal surface name | Relative integrated intensity | Crystal surface name | Relative integrated intensity | Crystal surface name | Relative integrated intensity | Crystal surface name | Relative integrated intensity | | |
| P 1 | (0, 0, 2) | 100 | (1, 0, 1) | 21.65 | (1, 0, 3) | 10.93 | (1, 0, 2) | 6.91 | 32.58 | 39.49 |
| D 1 | (1, 0, 1) | 100 | (0, 0, 2) | 71.97 | (1, 0, 3) | 40.23 | (1, 0, 2) | 27.27 | 112.20 | 139.47 |

TABLE 5

| Reference Example 1 | Main peak | | Second peak | | Third peak | | Fourth peak | | Sum of second and third peaks | Sum of second, third, and fourth peaks |
|---|---|---|---|---|---|---|---|---|---|---|
| | Crystal surface name | Relative integrated intensity | Crystal surface name | Relative integrated intensity | Crystal surface name | Relative integrated intensity | Crystal surface name | Relative integrated intensity | | |
| | (1, 0, 1) | 100 | (1, 0, 0) | 25.31 | (0, 0, 2) | 25.16 | (1, 1, 2) | 21.63 | 50.47 | 72.10 |

In Comparative Examples 1 and 2, since each result of the X-ray diffraction had no difference depending on the measurement locations in both the sputter surface direction and the target thickness direction, a sputter surface did not include two or more types of regions, and a side surface of the sputtering target did not include two or more types of regions. Then, in Comparative Examples 1 and 2, (002) orientation in the sputter surface was stronger than that of Ru powder. Therefore, the ruthenium sputtering targets of the Comparative Examples 1 and 2 had a high degree of structural anisotropy. For this reason, when Ru films were formed, the Ru films had low particle properties, but did not have sufficiently high film thickness uniformity and surface uniformity.

Meanwhile, in Example 1, the result of the X-ray diffraction differed depending on the measurement locations in both the sputter surface direction and the target thickness direction, a sputter surface included two or more types of regions, and a side surface of the sputtering target included two or more types of regions. Then, since Example 1 could be said to contain random anisotropic crystals, when the target was viewed as a whole, (002) orientation was weak and the degree of structural anisotropy was low. For this reason, when a Ru film was formed, the Ru film had low particle properties, and had high film thickness uniformity and surface uniformity.

According to Table 1 and Table 2, at 44.4% of the locations, the sum of the relative integrated intensities of the second peak and the third peak of the X-ray diffraction in the sputter surface direction of the sputtering target was larger than the relative integrated intensity of the main peak. In addition, at 66.7% of the locations, the sum of the relative integrated intensities of the second peak and the third peak of the X-ray diffraction in the target thickness direction of the sputtering target was larger than the relative integrated intensity of the main peak.

According to Table 1 and Table 2, at 88.9% of the locations, the sum of the relative integrated intensities of the second peak, the third peak, and the fourth peak of the X-ray diffraction in the sputter surface direction of the sputtering target was larger than the relative integrated intensity of the main peak. In addition, at 77.8% of the locations, the sum of the relative integrated intensities of the second peak, the third peak, and the fourth peak of the X-ray diffraction in the target thickness direction of the sputtering target was larger than the relative integrated intensity of the main peak.

According to Table 1 and Table 2, a ratio [(101)/(002)] between the number of measurement locations where (002) of the X-ray diffraction in the sputter surface direction of the sputtering target was the main peak of the relative integrated intensity and the number of measurement locations where (101) was the main peak of the relative integrated intensity was 40/100. In addition, a ratio [(101)/(002)] between the number of measurement locations where (002) of the X-ray diffraction in the target thickness direction of the sputtering target was the main peak of the relative integrated intensity and the number of measurement locations where (101) was the main peak of the relative integrated intensity was 40/100.

According to Table 1, a ratio [(103)/(002)] between the number of measurement locations where (002) of the X-ray diffraction in the sputter surface direction of the sputtering target was the main peak of the relative integrated intensity and the number of measurement locations where (103) was the main peak of the relative integrated intensity was 20/100.

According to Table 1, a ratio [(112)/(002)] between the number of measurement locations where (002) of the X-ray diffraction in the sputter surface direction of the sputtering target was the main peak of the relative integrated intensity and the number of measurement locations where (112) was the main peak of the relative integrated intensity was 20/100.

According to Table 2, a ratio [(110)/(002)] between the number of measurement locations where (002) of the X-ray diffraction in the target thickness direction of the sputtering target was the main peak of the relative integrated intensity and the number of measurement locations where (110) was the main peak of the relative integrated intensity was 40/100.

From these results, it was confirmed that in Example 1, when the target was viewed as a whole, (002) orientation was weak and the degree of structural anisotropy was low.

REFERENCE SIGNS LIST

100, 200, 300, 400 SPUTTERING TARGET
R1 to R8 REGION ON SPUTTER SURFACE
R1, R4, R6 to R10 REGION ON SIDE SURFACE (CROSS SECTION)
O CENTER
L, Q IMAGINARY CROSSING LINE
S1 to S9 MEASUREMENT LOCATION ON SPUTTER SURFACE
C1 to C9 MEASUREMENT LOCATION ON CROSS SECTION

What is claimed is:

1. A ruthenium-based sputtering target having a cast structure,
wherein a sputter surface of the sputtering target includes at least two or more types of regions, and crystal surfaces in the regions are different from each other, each of the crystal surfaces being specified by a main peak of X-ray diffraction, and wherein in (condition 1) or (condition 2), at 40% or more of locations, a sum of relative integrated intensities of a second peak and a third peak of X-ray diffraction in a sputter surface direction or a target thickness direction of the sputtering target is larger than a relative integrated intensity of the main peak, where (condition 1)

in relation to the sputter surface direction, the sputtering target is a disk-shaped target having a center O, a radius r, and a thickness t, and the X-ray diffraction measurement locations are nine locations in grand total including one location at the center O, four locations 0.45r away from the center O in total, and four locations 0.9r away from the center O in total on imaginary crossing lines orthogonal to each other at the center O as a point of intersection, or in relation to the target thickness direction, a cross section is formed which passes through one line of the imaginary crossing lines, the cross section has a rectangular shape having a vertical side of t and a horizontal side of 2r, and the X-ray diffraction measurement locations are nine locations in grand total including three locations including a center X as an X point, and locations 0.45t away upward and downward from the center X as an a-point and a b-point on a vertical transversal passing through the center O in total, and two locations 0.9r away from the a-point toward right and left sides in total, two locations 0.9r away from the X-point toward the right and left sides in total, and two locations 0.9r away from the b-point toward the right and left sides in total on the cross section, or (condition 2)

in relation to the sputter surface direction, the sputtering target has a thickness of t and has a rectangular shape having a vertical length L1 and a horizontal length L2, wherein the rectangular shape includes a square shape in which L1 and L2 are equal, and alternatively, the rectangular shape includes a rectangular shape obtained by developing a side surface of a cylindrical shape having a length J and a circumference K, and in this form, L2 corresponds to the length J, L1 corresponds to the circumference K, and a relationship of J>K, J=K, or J<K is established between the length J and the circumference K, and when imaginary crossing lines are orthogonal to each other at a center of gravity O as a point of intersection, and the imaginary crossing lines are orthogonal to sides of the rectangular shape, the X-ray diffraction measurement locations are nine locations in grand total including one location at the center of gravity O, and two locations away by a distance of 0.25L1 from the center of gravity O in a vertical direction in total, two locations away by a distance of 0.25L2 from the center of gravity O in a horizontal direction in total, two locations away by a distance of 0.45L1 from the center of gravity O in the vertical direction in total, and two locations away by a distance of 0.45L2 from the center of gravity O in the horizontal direction in total on the imaginary crossing lines, or in relation to the target thickness direction, a cross section is formed which passes through a line selected out of the imaginary crossing lines, the line being parallel to one side of a vertical side of L1 and a horizontal side of L2, when the one side is the horizontal side of L2, the cross section has a rectangular shape having a vertical side of t and the horizontal side of L2, and the X-ray diffraction measurement locations are nine locations in grand total including three locations including a center X as an X-point and locations 0.45t away upward and downward from the center X as an a-point and a b-point on a vertical transversal passing through the center of gravity O in total, and two locations 0.45L2 away from the a-point toward right and left sides in total, two locations 0.45L2 away from the X-point toward the right and left sides in total, and two locations 0.45L2 away from the b-point toward the right and left sides in total on the cross section.

2. The ruthenium-based sputtering target according to claim 1,
wherein a side surface of the sputtering target includes at least two or more types of regions, and crystal surfaces in the regions are different from each other, each of the crystal surfaces being specified by a main peak of X-ray diffraction.

3. The ruthenium-based sputtering target according to claim 1,
wherein in (condition 1) or (condition 2), at 75% or more of the locations, a sum of relative integrated intensities of the second peak, the third peak, and a fourth peak of the X-ray diffraction in the sputter surface direction or the target thickness direction of the sputtering target is larger than the relative integrated intensity of the main peak.

4. The ruthenium-based sputtering target according to claim 1,
wherein in (condition 1) or (condition 2), a ratio [(101)/(002)] between the number of measurement locations where (002) of the X-ray diffraction in the sputter surface direction or the target thickness direction of the sputtering target is the main peak of the relative integrated intensity and the number of measurement locations where (101) is the main peak of the relative integrated intensity is in a range of 20/100 to 70/100.

5. The ruthenium-based sputtering target according to claim 1,
wherein in (condition 1) or (condition 2), a ratio [(103)/(002)] between the number of measurement locations where (002) of the X-ray diffraction in the sputter surface direction of the sputtering target is the main peak of the relative integrated intensity and the number of measurement locations where (103) is the main peak of the relative integrated intensity is in a range of 10/100 to 40/100.

6. The ruthenium-based sputtering target according to claim 1,
wherein in (condition 1) or (condition 2), a ratio [(112)/(002)] between the number of measurement locations where (002) of the X-ray diffraction in the sputter surface direction of the sputtering target is the main peak of the relative integrated intensity and the number of measurement locations where (112) is the main peak of the relative integrated intensity is in a range of 10/100 to 30/100.

7. The ruthenium-based sputtering target according to claim 1,
wherein in (condition 1) or (condition 2), a ratio [(110)/(002)] between the number of measurement locations where (002) of the X-ray diffraction in the target thickness direction of the sputtering target is the main peak of the relative integrated intensity and the number of measurement locations where (110) is the main peak of the relative integrated intensity is in a range of 15/100 to 50/100.

8. The ruthenium-based sputtering target according to claim 1,
wherein a shape of the target is a cylindrical shape, a disk shape having a diameter of 250 mm or more, a rectangular plate shape having at least one side of 250 mm or more, or a square plate shape having a side of 250 mm or more, and the ruthenium-based sputtering target includes a welded portion or a friction stir welding portion.

* * * * *